United States Patent [19]

Furuya

[11] Patent Number: 4,573,501

[45] Date of Patent: Mar. 4, 1986

[54] APPARATUS FOR CUTTING AND FORMING LEADS

[75] Inventor: Harumi Furuya, Tokyo, Japan

[73] Assignee: Henry Mann, Inc., Huntingdon Valley, Pa.

[21] Appl. No.: 645,944

[22] Filed: Aug. 30, 1984

Related U.S. Application Data

[63] Continuation-in-part of Ser. No. 522,064, Aug. 10, 1983, abandoned.

[30] Foreign Application Priority Data

Oct. 30, 1982 [JP] Japan ................. 57-191178

[51] Int. Cl.⁴ .................................................. B21F 1/02
[52] U.S. Cl. ..................................... 140/147; 29/566.3
[58] Field of Search ........................... 29/33 M, 566.3; 140/147; 72/93, 335

[56] References Cited

U.S. PATENT DOCUMENTS

| | | | |
|---|---|---|---|
| 3,769,823 | 11/1973 | Greeninger | 29/566.3 |
| 4,279,278 | 7/1981 | Weresch | 140/147 |
| 4,282,908 | 8/1981 | Bankes et al. | 140/147 |

FOREIGN PATENT DOCUMENTS

| | | | |
|---|---|---|---|
| 1414234 | 11/1975 | United Kingdom | 29/33 M |
| 1542208 | 3/1979 | United Kingdom | 29/33 M |
| 2018167 | 10/1979 | United Kingdom | 29/33 M |

Primary Examiner—William R. Briggs
Attorney, Agent, or Firm—Panitch Schwarze Jacobs & Nadel

[57] ABSTRACT

An apparatus for cutting and forming leads of electronic parts to desired shape comprises a main body including a feeder, a cutter, and a former, and a hopper attached to the body close to the feeder. The hopper includes a received with aprons, a belt conveyor arranged adjacent to the aprons and operated by belt wheels on shafts, a pair of covers having guide and straight portions, and a pair of guides located near the conveyor. The feeder includes one pair each of toothed feed wheels and outer feed wheels mounted on a countershaft. The cutter includes one pair each of guide holders and the inside cutting edges with their edges extended beyond the dedendum circles at the outer feed wheels. The former includes one pair each of bender holders and benders outside, both mounted on the cutter shaft. Each bender has a leaf spring wide enough to cover the periphery, from the dedendum circle to the tooth tops, of the associated fed wheel so as to bend and form the lead in each tooth space of the wheel. The belt conveyor is driven by a motor through endless belts and pulleys on the countershaft and driving belt wheel shaft. A pressure plate is held on the underside of the carrying run section of the conveyor to press the section against the covers to straighten the leads. An alternative to the hopper is a tape guide mechanism which includes a pair of tape guides to receive and guide the tapes connecting the outer ends of leads in a row and transfer the leads to the outer feed wheels.

10 Claims, 17 Drawing Figures

APPARATUS FOR CUTTING AND FORMING LEADS

This application is a continuation-in-part of U.S. patent application Ser. No. 522,064 filed Aug. 10, 1983, now abandoned.

BACKGROUND OF THE INVENTION

This invention relates to an apparatus for cutting and forming leads, and more specifically to an apparatus of the character for finishing the leads of electronic parts consisting of an element or part body in the center and two leads connected to or leading out from the both ends along the axis thereof, such as resistors, capacitors, diodes, plated-wire memories and other axial parts.

Conventionally, the leads of those devices are trimmed and bent or otherwise formed to suit the intended uses manually with cutting pliers or radio pincers. The parts to be handled with such machine shop tools usually are small in size and use leads of copper or other soft metal wires having good electrical properties. The leads are therefore often undesirably bent, twisted or otherwise distorted while being worked to shape. The distorted wires will render their subsequent insertion in the holes of printed circuit boards difficult.

When working with tools, the workers' hands frequently come in direct contact with the parts, rusting their leads and causing failure at the time of soldering, thus giving many defective products. In addition, the routine practice makes simultaneous cutting and forming of leads impossible.

The present invention is aimed at providing an apparatus capable of overcoming the aforementioned difficulties of the prior art and performing both cutting and forming of electronic part leads automatically and simultaneously.

DESCRIPTION OF PREFERRED EMBODIMENTS

Figure 1:
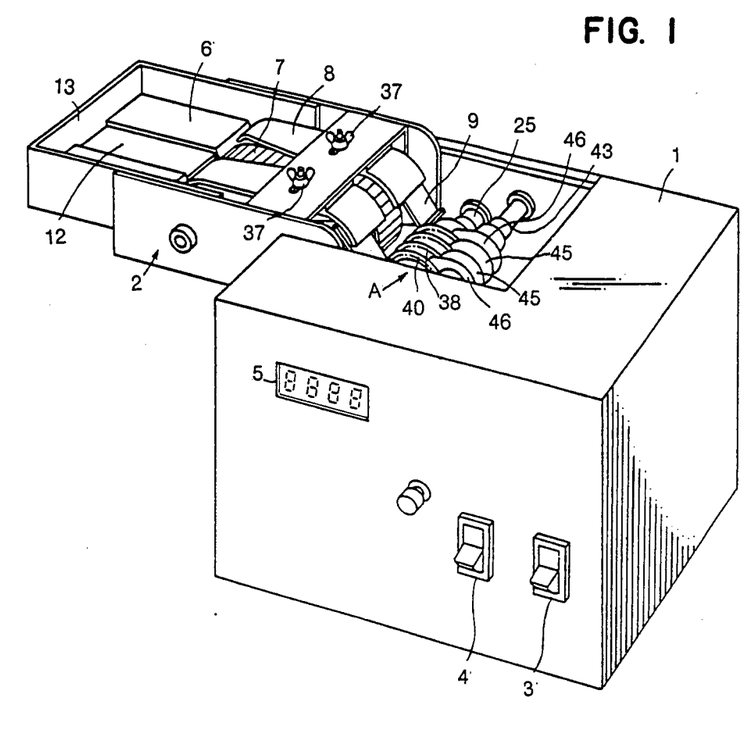
FIG. 1 is a perspective view of an apparatus embodying the invention.

Referring to FIG. 1, which shows an embodiment of the invention in perspective, the numeral 1 designates main body of the apparatus, which carries a hopper 2 on one side and has a main switch 3, a drive switch 4, and a counter 5, all exposed partly on the front face.

The hopper 2 generally consists of a receiver 6, a belt conveyor 7 for carrying electronic parts 14 to a feeder A, a pair of covers 8 the distance between which is adjustable, and a pair of guides 9 located at the front end of the conveyor 7.

The receiver 6 is provided with a channel 12 of a predetermined width in the center and is surrounded on both sides and the rear end with side and rear wall plates 13. The channel 12 has a width less than the overall length of each electronic part 14, with its leads inclusive, but larger than at least the length of the element or part body 10 itself.

At the front end of the receiver 6 are formed aprons 15 which are shaped to receive the leads at both ends of the part bodies 10. The aprons 15 thus serve to transfer the electronic parts 14 from the receiver 6 to the belt conveyor 7.

The belt conveyor 7 is slightly narrower than the channel 12 and located at one end adjacent to the front end 16 of the channel and at the opposite end close to a feed wheel 38 of a feeder A. The conveyor 7, made of rubber, urethane, soft synthetic resin, or other flexible material, has a number of grooves 17 formed at a given pitch and at right angles to the direction in which the conveyor moves, each of the grooves being at least wide enough to receive an electronic part body loosely.

This conveyor is driven in the direction of the arrow by a driving belt wheel 18 and a driven wheel 19. The latter wheel 19 is revolvably mounted on a shaft secured to a pair of plates 20 which, in turn, are attached to the outer sides of the side plates 13. The driving belt wheel 18 is revolvably mounted on a shaft 22 likewise secured to the plates 20.

On one end of the shaft 22 is mounted a pulley 23, which is driven, via an endless belt 24, by another pulley 26 fixed to a countershaft 25 which, in turn, is journaled in the main body 1 of the apparatus. The countershaft 25 is driven by a motor 27 through a pulley 29 mounted on its main shaft 28 and through an endless belt 31 extended around the pulley 29 and another pulley 30 on the countershaft 25.

The pair of covers 8, disposed in parallel and closely above the both edges of the belt conveyor 7, are spaced apart a distance approximately equal to the length of the part bodies 10 to be handled. The covers have a length about the same as the working stretch of the belt conveyor and are curved at both ends in conformity with the conveyor contours at both ends of its carrying run. Inner edges of the covers 8 have straight portions 34 opposed to each other and have obliquely cut guide portions 35 facing the receiver 6 to receive and guide the part bodies 10.

Bolts 36 are inserted through holes formed at about midpoints of the covers 8 and thence through lateral slots 33 formed in a cross plate 32. With butterfly nuts 37 tightened on the bolts, the distance between the covers can be adjusted as desired.

Figure 4:
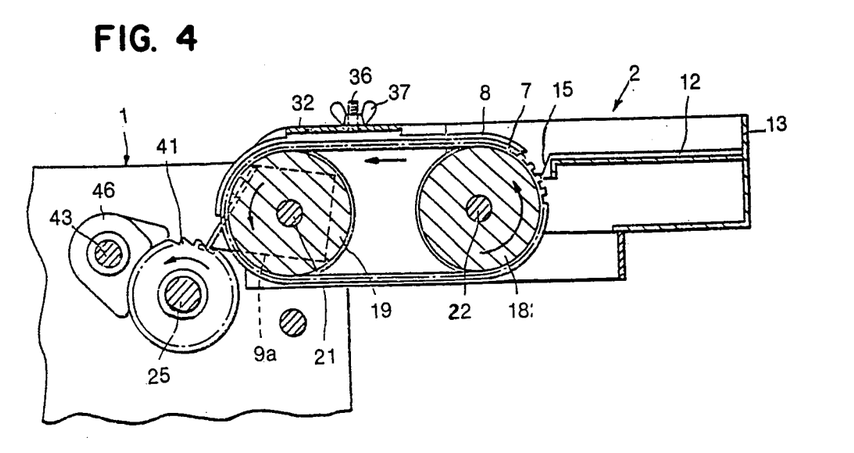
FIG. 4 is a fragmentary view illustrating the relations between a hopper and feed wheels.

Guides 9, which transfer the electronic parts 14 by their leads 11 from the belt conveyor 7 to a feed wheel 38 of the feeder A, are disposed in close proximity to the belt wheel 19. Each guide 9 is pivotally supported by a shaft 21 so that its lower portion 9a is turnable. On the front end of the guide is formed an apron 39 extended beyond the front end of the belt conveyor 7 to receive the leads of each electronic part 14 from the conveyor.

The main body 1 comprises, in addition to the feeder A for electronic parts, a cutter B for leads 11 and a former C.

Figure 3:
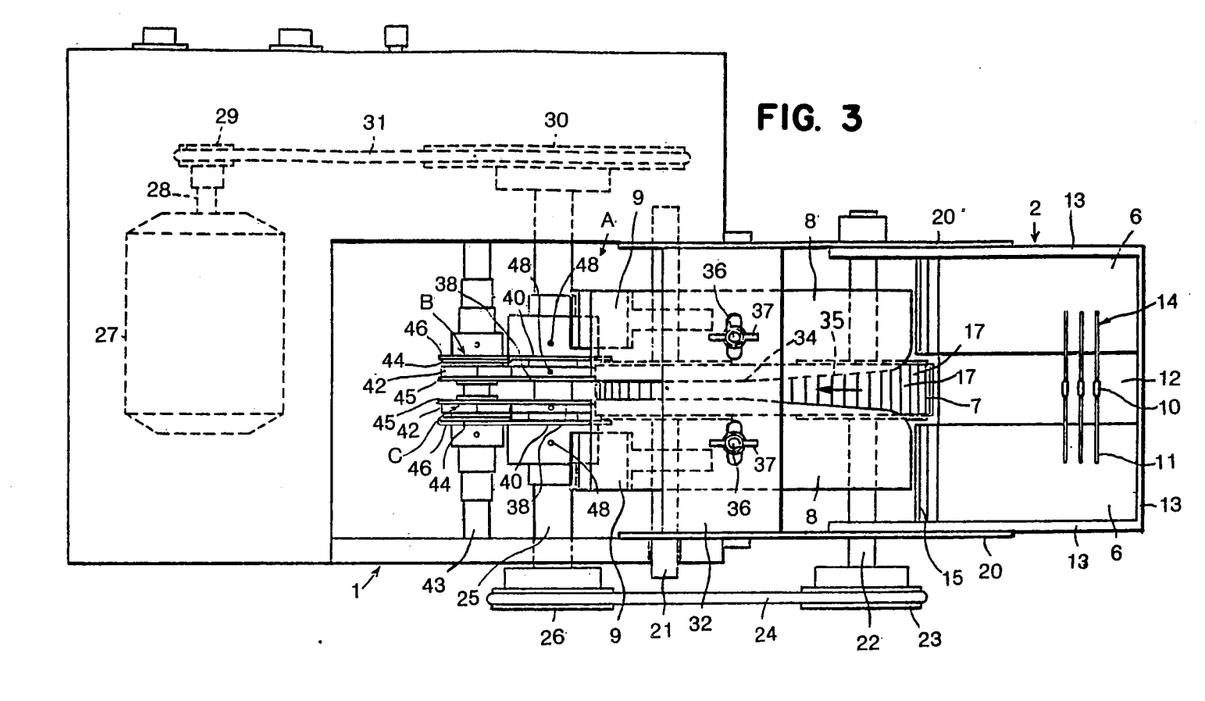
FIG. 3 is a plan view of the apparatus.

The feeder A is composed of the above-mentioned pair of feed wheels 38 and a pair of outer feed wheels 40 mounted, respectively, on the outer sides of the wheels 38. The feed wheels 38 are fixedly mounted on about the middle of the countershaft 25, spaced apart a distance somewhat more than the length of each element or part body 10, by setscrews 48 in such a manner that the distance is adjustable whenever desired.

Outside the feed wheels 38, there are disposed the pair of outer feed wheels 40, respectively, at a distance from the inner wheel equivalent to the desired length of each lead of the electronic part, or at the point beyond which the excess wire is to be cut off. The outer wheels 40 are secured, together with the wheels 38, to the countershaft 25 by setscrews 48 so that their distances are adjustable.

The pairs of feed wheels 38, 40 are of the same diameter and are arranged to run synchronously. They have teeth 41 formed at a given pitch on their peripheries. The teeth 41 are so shaped as to take up the leads 11 connected to each electronic part body 10 from the part-receiving apron 39, hold them until benders of the former C complete forming the leads, and then release the formed leads.

Figure 6:
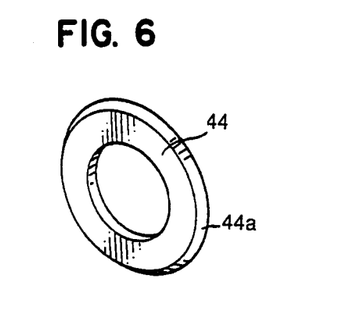
FIG. 6 is a perspective view of a cutting blade.

The cutter B and the former C are arranged adjacent to the feeder A. The cutter B comprises a pair of guide holders 46 and a pair of cutting blades 44 contiguous to the inner sides of the holders 46. The holders 46 are located generally in alignment with the outer feed wheels 40. They have, on their sides facing the feeder A, arcuate grooves 47 of a curvature generally conforming to the outside diameter of the outer feed wheels 40, and are arranged to engaged the wheels. Instead of a one-piece structure, each guide holder 46 may consist of a plate having an arcuate groove of a curvature generally conforming to the peripheral geometry of the associated feed wheel 40 and a larger plate superposed with the first plate.

Inside the pair of guide holders 46, the cutting blades 44 are installed with their edges 44a extended beyond the dedendum circles of the mating outer feed wheels 40. The cutting blades 44 may be of circular edges which can perform a 360-deg. cutting operation. The guide holders 46 are fixedly mounted on a shaft 43 by setscrews 48.

Figure 5:
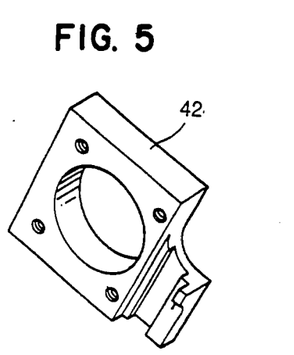
FIG. 5 is a perspective view of a bender.

The former C comprises a pair of bender holders 45 similar in construction to the guide holders 46 and a pair of benders 42. The bender holders 45 in a pair are located in alignment with the feed wheels 38, and the benders are disposed on the outer sides of the holders 45.

Figure 8:
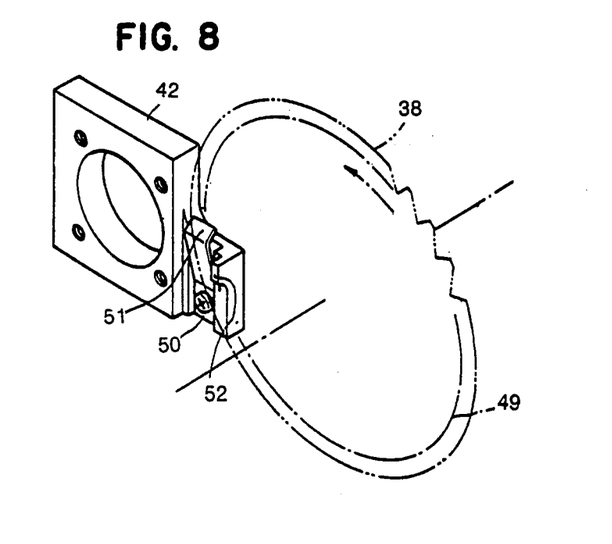
FIG. 8 is a perspective view showing the relationship between the bender and one of the feed wheels.
Figure 9:
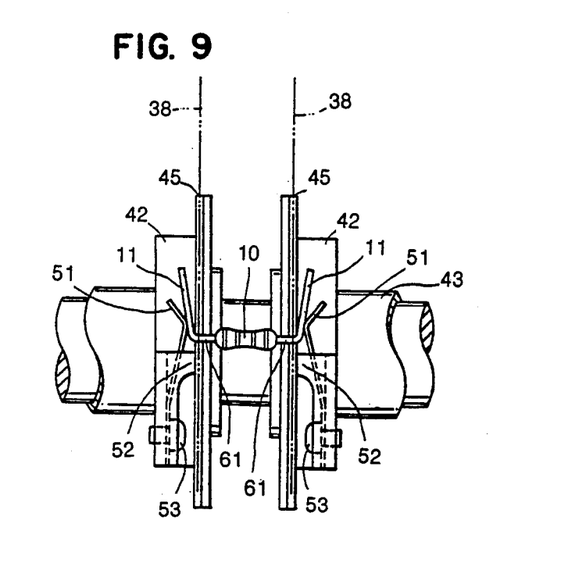
FIG. 9 is a fragmentary view of an arrangement bending a work to a desired form.
Figure 10:
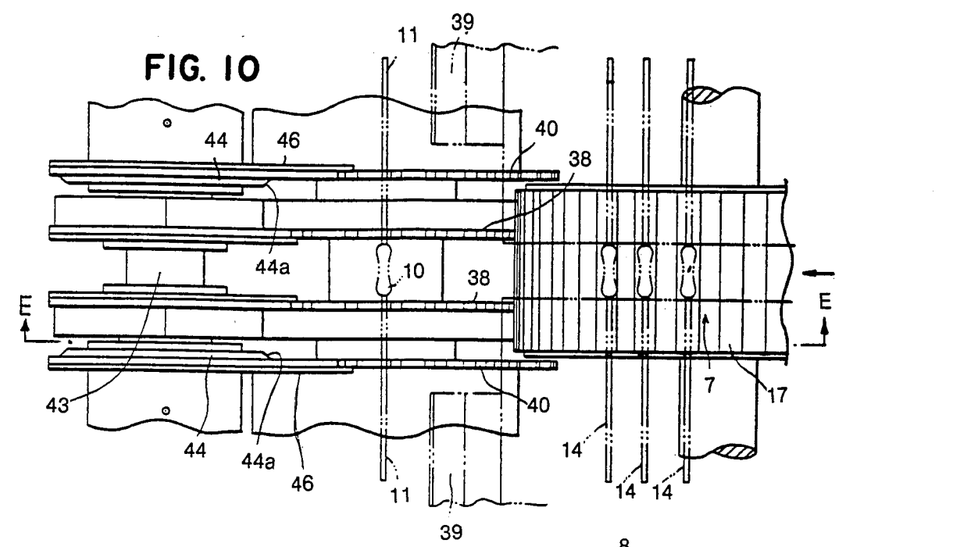
FIG. 10 shows an arrangement for conveying electronic parts.
Figure 11:
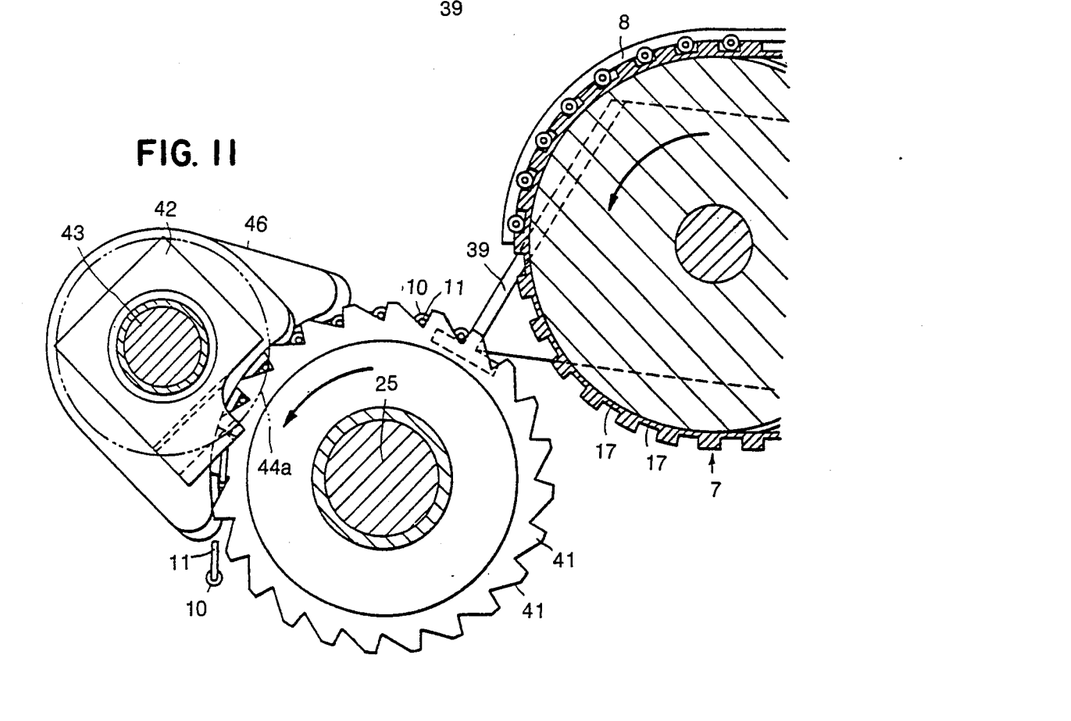
FIG. 11 is a sectional view taken on the line E—E of FIG. 10 to show the flow pattern of electronic parts around each feed wheel and the associated components.

Each bender 42 has an extension 50, to which a leaf spring 51 of a predetermined rigidity is fixed at one end. This leaf spring 51 is desirably bent slightly inward at the free end to force down part of each incoming lead 11 to produce a nearly right-angled bend. Each spring 51 is at least wide enough, and is so located as to cover the periphery of the associated feed wheel 38, from its dedendum circle 49 to the tooth top. At the outer end of the extension 50 is formed a protuberance 52 to guide the feed wheel 38.

Although the leaf springs 51 are shown fastened to the benders 42 by machine screws 53, they may be secured in place by riveting instead. Also, while the cutter B and the former C are shown mounted on the common shaft 43, either unit alone may be used there for exclusive cutting or forming service.

Figure 7:
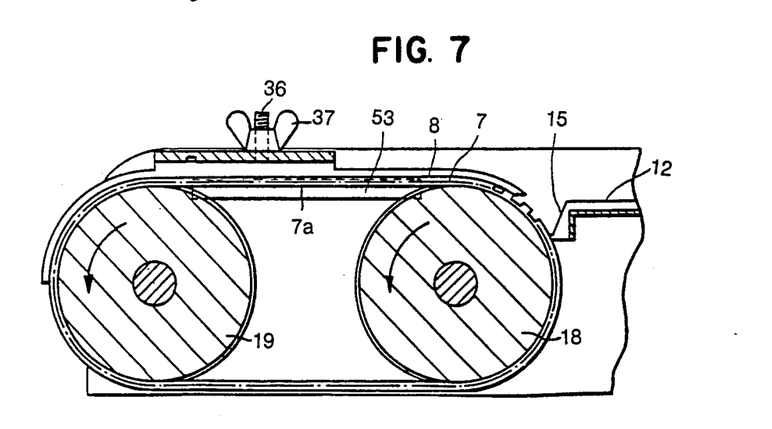
FIG. 7 shows a modified form of hopper.

FIG. 7 illustrates a modified form of the hopper 2, which straightens rather crooked or otherwise distorted leads 11 between the portion 7a of the belt conveyor in the carrying run and the covers 8 thereon. For the straightening purpose a pressure plate 53 is held in close contact with the underside of the conveyor portion 7a in the carrying run so as to press the conveyor against the covers 8.

Figure 12:
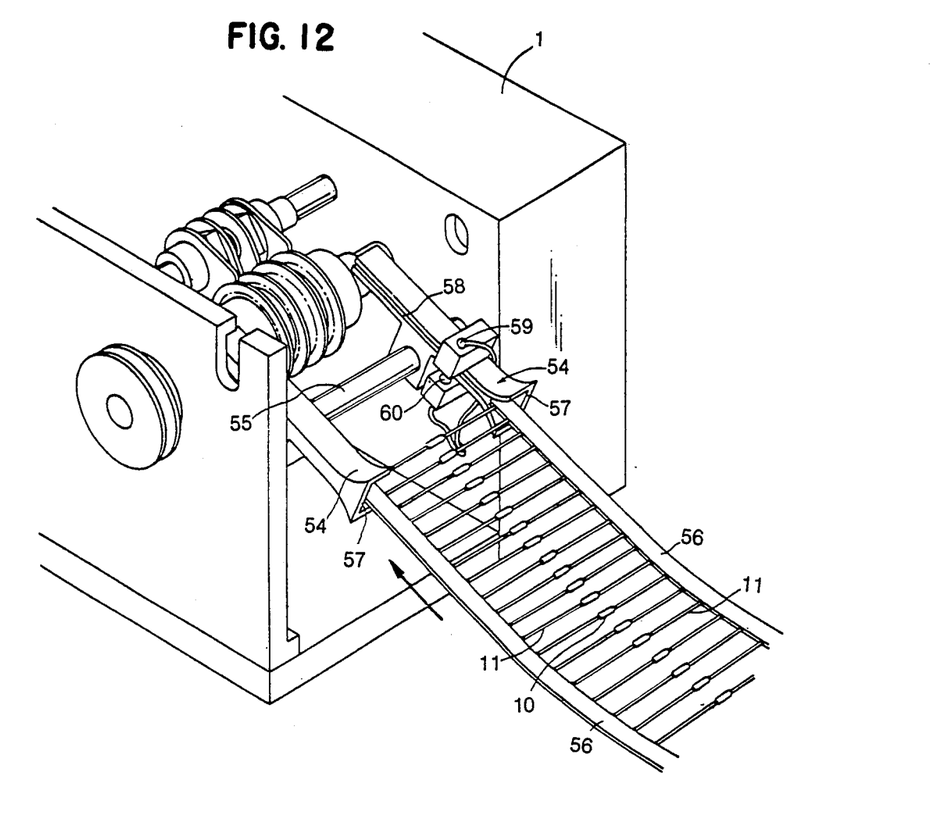
FIG. 12 is a perspective view of a tape-guide mechanism.

FIG. 12 shows a mechanism for guiding a tape-connected row of electronic parts. The mechanism comprises a pair of tape guides 54 of a predetermined length, which are supported by a shaft 55 in such a manner that their distance is adjustable in conformity with the distance between the tapes 56. Each tape guide 54 has a flared inlet 57 to receive the tape 56 and also has a guide slot 58 extended to the point where it overlaps the associated feed wheel 38.

On top of one tape guide 54 is mounted a light-emitting diode 59, and a phototransistor 60 is secured to the underside of the guide in such relative position that they coact to detect the passage of leads therebetween and allow the counter 5 on the front of the main body 1 to display the count.

In the apparatus of the invention constructed as above, the covers 8 in a pair are located so that their straight portions 34 in parallel are spaced apart a distance slightly greater than the length of each electronic part body 10, and the pair of feed wheels 38 are disposed apart the same distance as the straight portions 34. The pair of outer feed wheels 40 are mounted in position where leads 11 are to be trimmed by cutting.

The operation of the apparatus according to the invention will now be explained.

Electronic parts 14 are first led to the hopper, with the part bodies 10 supported in the channel 12 of the receiver 6 and their leads 11 on the rest of the receiver, and allowed to fall onto the apron 15 and thence in the grooves 17 of the moving belt conveyor 7. Each part 14, with its body 10 carried between the guide portions 35 and the straight portions 34, approaches the aprons 15 and fall thereon under its own weight, so that its leads 11 are received by the aprons 15. The leads are then taken up by the teeth of the inner feed wheels 38 and also by the outer feed wheels 40 so that the part body 10 is held between the leads. In this way the electronic part is conveyed from the feeder A to the cutter B. Upon arrival at the latter, the leads 11 are trimmed by the cutting edges 44a to predetermined lengths, and the part is farther carried by the feed wheels 38 to the former C.

In the former C the leads 11 are bent by the leaf springs 51 to a desired shape, and then the electronic part 14 falls by gravity.

Figure 2:
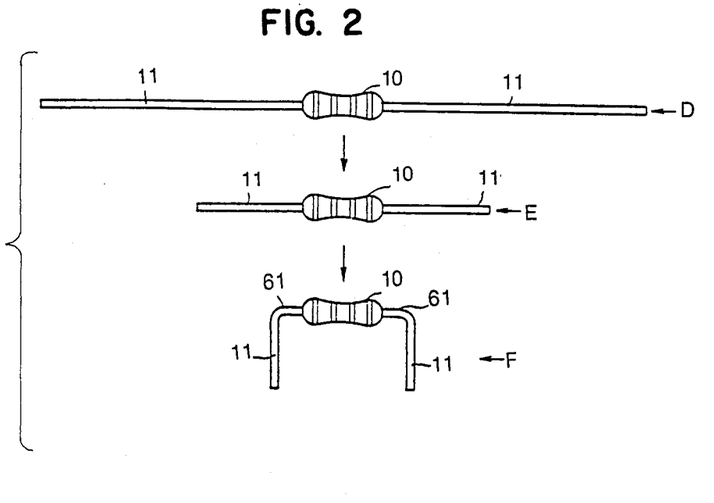
FIG. 2 illustrates a sequence of steps for forming the leads of an electronic part.

Turning to the sequential views of FIG. 2, the part is shown in the state before cutting (D), after cutting (E), and after forming (E).

Where either lead 11 of the part is to be longer than the other, it is only necessary to shift the position of the associated outer feed wheel 40 from the center of the part body 10 by the distance equal to the length to be added and shift accordingly the guide holder 46 engaged with the particular wheel.

Also, if either lead of the part is to have a larger shoulder than the other upon forming, the end is attained by shifting the associated feed wheel 38 and outer feed wheel 40 and correspondingly shift the positions of the associated bender holder 45 and guide holder 46.

Figures 13, 14, 15, 16:
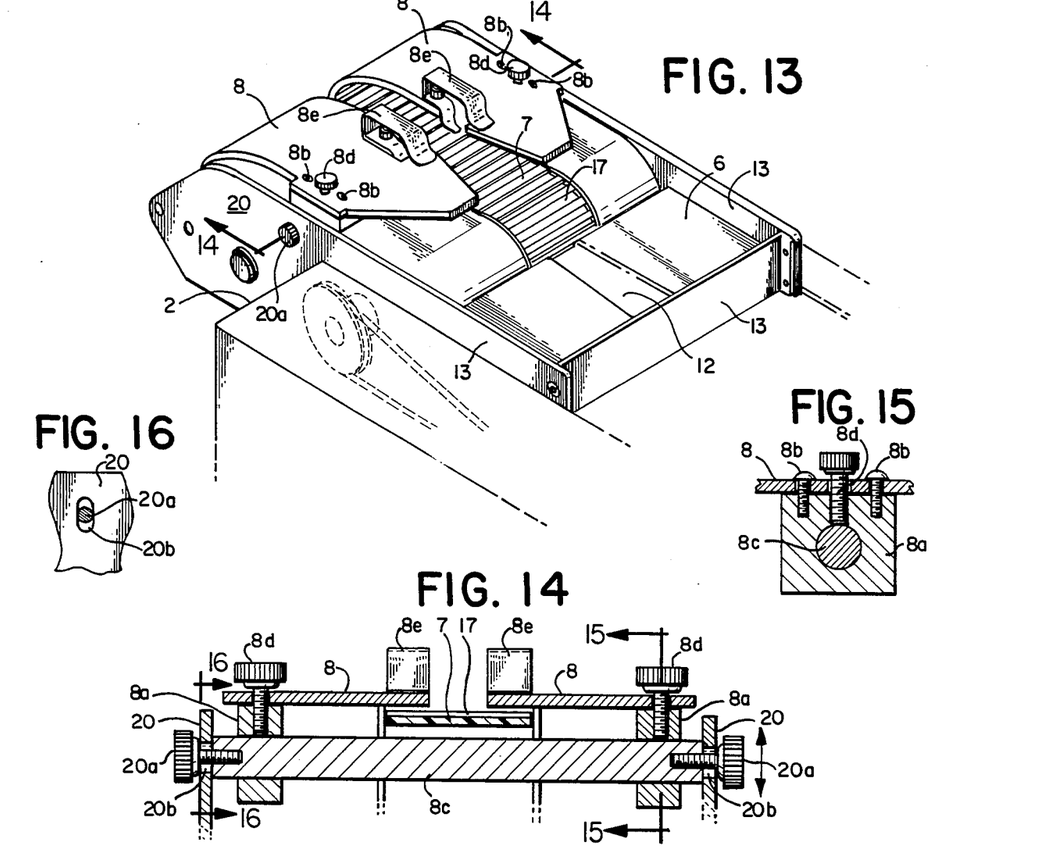
FIG. 13 is a perspective view of a modified form of the hopper.
FIG. 14 is a sectional view taken along line 14—14 of FIG. 13.
FIG. 15 is a sectional view taken along line 15—15 of FIG. 14.
FIG. 16 is a sectional view taken along line 16—16 of FIG. 14.

FIGS. 13–16 show another modified form of the hopper 2 of the present invention. As best shown in FIG. 13, the hopper 2 includes a generally rectangular receiver 6 and an endless belt conveyor 7 which are substantially the same as those of the previously described embodiments. The hopper 2 also includes a pair of cover members 8 overlying portions of the belt conveyor 7. As with the previously described covers 8, the cover members 8 of the present embodiment are laterally moveable to permit adjustment of the open space between the two cover members 8 depending upon the length of the body portion of the components being processed.

As best seen in FIGS. 14 and 15, each of the cover members 8 is secured to an underlyiny block-like supporting member 8a by suitable attachment means, such as a pair of screws or rivets 8b. Each of the supporting members 8a has a generally circular opening extending laterally through the center thereof (best shown in FIG. 15). Each of the supporting blocks 8a is supported by a generally cylindrical shaft member 8c which extends through the respective supporting member openings. The shaft member 8c, which extends through the belt conveyor 7, is generally horizontally oriented and is releasably secured to the apparatus sidewalls or plates 20 in a manner which will hereinafter be described.

As shown in FIG. 15, knurled screw members 8d pass through appropriately sized openings in the cover members 8 and threadingly engage similarly threaded openings extending through the supporting members 8a. When the screw members 8a are tightened, the ends of the screw members 8d engage the shaft member 8c to hold the supporting members 8a and the cover members 8 in place on the shaft member 8c. By loosening the knurled screw members 8d, the supporting members 8a are slideable laterally along the supporting shaft member 8c for adjusting the lateral position of the attached cover members 8. In this manner, the two cover members 8 may be adjusted with respect to each other to establish a desired spacing therebetween, depending upon the size of the components being processed by the apparatus. Once the spacing is established, the screw members 8d may be tightened against the shaft member 8c to lock the cover members 8 in place.

In addition to being laterally adjustable with respect to each other, the cover members 8 are adjustable vertically with respect to the belt conveyor 7 in order to vary the spacing between the underside of the cover members 8 and the belt conveyor 7. Such vertical adjustment is accomplished by vertical adjustment of the supporting shaft member 8c. The shaft member 8c is secured to the plates 20 at each axial end by a knurled screw member 20a. The knurled screw members 20a pass through slotted openings 20b within the plates 20 and threadingly engage the axial ends of the shaft member 8c. By loosening each of the knurled screw members 20a, the shaft member 8c may be moved upwardly or downwardly to set the cover members 8 to a desired height above the belt conveyor 7. The screw members 20a may then be tightened to hold the supporting shaft member 8c at the desired height.

By adjusting the height of the cover members 8, the hopper 2 is able to accommodate components of varying thicknesses. In this manner, the hopper 2 can accommodate thicker sized components without the leads of the components getting caught up between the belt conveyor 7 and the underside of the cover members 8.

As shown in FIGS. 13 and 14, each of the cover members 8 further includes a clip member 8e on its upper surface. The clip members 8e function to catch and remove components which are not properly seated within the grooves 17 of the belt conveyor 7, particularly components with leads which are skewed or otherwise not properly oriented beneath the cover members 8. The clip members 8e conveniently catch such components and remove them from the belt conveyor 7 for recycling back to the receiver 6.

Figure 17:
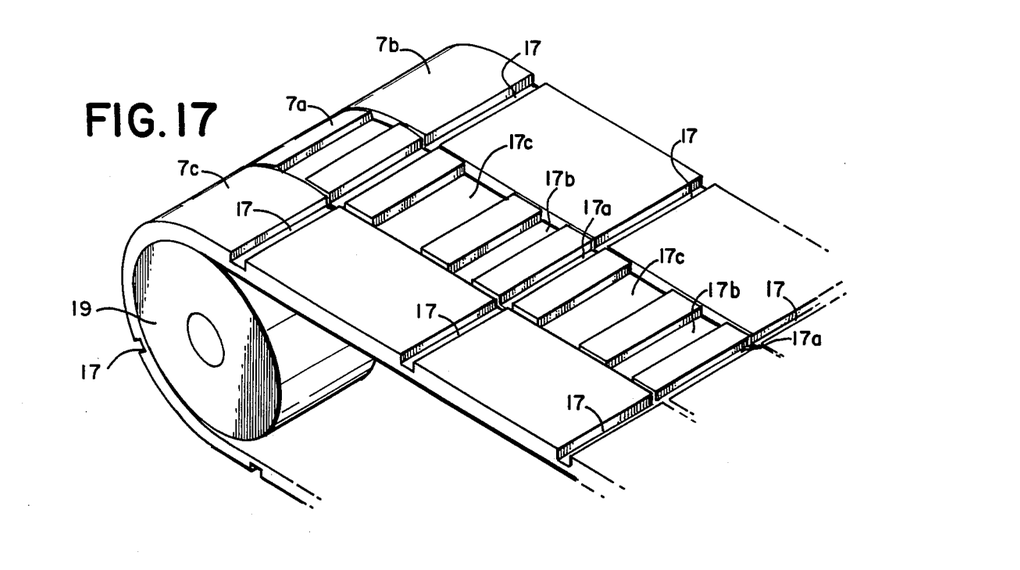
FIG. 17 is an enlarged perspective view of a modified form of the conveyor belt.

Referring now to FIG. 17, there is shown a further modified form of of the belt conveyor of the apparatus which provides for the processing of components which differ in body size. The belt conveyor shown in FIG. 17 is comprised of three individual endless belts 7a, 7b and 7c which rotate together by means of a common drive roller or wheel 19. The combined width of the three belts 7a, 7b and 7c is substantially the same as that of the belt conveyor 7 of the above-described embodiments. However, the component receiving grooves which extend across the three belts 7a, 7b and 7c are different from that of the above-described belt conveyors.

The two outer belts 7b and 7c include a plurality of spaced grooves 17 which are substantially the same depth and thickness as the grooves 17 of the above-described belt conveyors 7. The center belt 7a has a similar plurality of spaced sets of differing sized grooves 17a, 17b and 17c. In the present embodiment there are three different sized grooves shown, it being understood that a lesser or greater number of such grooves could be provided.

The width of one of the grooves 17a is substantially the same as that of the grooves 17 in the outer two belts 7b and 7c. The other two grooves 17b and 17c are wider than groove 17a to accommodate components having larger body sizes. For example, groove 17a may be sized to accommodate a standard one-eighth watt resistor, while groove 17b may be sized to accommodate a standard one-fourth watt resistor and groove 17c may be sized to accommodate a standard one-half watt resistor. The grooves 17 of the outer two belts 7b and 7c are sized to accommodate the lead portion of any size component.

The apparatus also includes means (not shown) for loosening the tension on the conveyor belts 7a, 7b and 7c to permit the alignment of the belts to be adjusted. As shown in FIG. 17, the three belts 7a, 7b and 7c have been aligned so that the grooves 17 of the outer two belts 7b and 7c are in registry with each other and with the smallest groove 17a of the center belt 7a. When the three belts, 7a, 7b and 7c are aligned in this manner, the apparatus is tailored to accommodate smaller components, such as standard one-eighth watt resistors, the body of the component fitting into the groove 17a of the center belt 7a and the leads of the component fitting into the grooves 17 on the two outer belts 7b and 7c. The wider grooves 17b and 17c of the inner belt are not aligned with any grooves 17 of the outer belts 7b and 7c so that no components will be picked up within these wider grooves 17b and 17c.

The apparatus may be adjusted to process larger components by merely loosening the tension of the belts and aligning the belts so that the grooves 17 of the outer two belts 7b and 7c are in registry with each other and with the central portion of the desired groove 17b or 17c of the center belt 7a. The spacing between the sets of grooves 17a, 17b and 17c of the center belt is such that when the grooves 17 of the outer two belts are properly aligned with any one of the grooves 17a, 17b or 17c of the center belt 7a, the corresponding grooves 17 of the outer belts 7b and 7c are also in registry with all of the other grooves of the same size along the remainder of the center belt 7a.

It will be appreciated by those skilled in the art that the previously described split belt arrangement could be employed in connection with any of the above-discussed embodiments and forms of the apparatus. The use of the split belt arrangement provides greater flexibility with regard to the use of the apparatus with different sized components.

As described above, the present invention renders it possible to trim and bend the leads of electronic parts in simultaneous cutting and forming operations for mass production.

Undesirably bent or distorted leads can be properly straightened as they are carried by the belt conveyor up to the receiving aprons. The midpoints of the electronic part bodies in a row are aligned as desired while the parts are carried along the guide and straight portions of the covers to the feeder A.

The electronic parts, originally instable on a plane, are supported by at least two points, and their leads can be cut and formed to desired contours in a stable manner.

It will be recognized by those skilled in the art that changes could be made to the above-described embodiments without departing from the broad inventive concepts thereof. It is understood, therefore, that this invention is not limited to the particular embodiments disclosed, but is intended to cover any modifications which are within the scope and spirit of the invention defined by the appended claims.

What is claimed is:

1. An apparatus for cutting and forming part leads comprising a feeder, a cutter, a former, and a hopper, said hopper including a receiver, a belt conveyor arranged adjacent to said receiver and operated by a driven belt wheel, a pair of covers each of which has a guide portion and a straight portion, said covers being disposed above the belt conveyor in such a manner that the distance between said covers can be adjusted according to the length of the part body of the parts to be handled, and a pair of guides located in the proximity of said belt conveyor and spaced wider apart than the width of said belt conveyor said feeder including a pair of feed wheels having peripheral teeth at a predetermined pitch and spaced apart the same distance as said straight portions of said covers and mounted on a shaft, so as to be shifted in position relative to each other, and a similar pair of outer feed wheels shiftably mounted on the same shaft on the outer sides of said feed wheels and at distances where the leads connected to each part body are to be cut, said cutter including a pair of guide holders shiftably mounted on a shaft generally in alignment with, and close to, said outer feed wheels, and cutting blades installed on the inner sides of said guide holders, with their edges extended beyond the dedendum circles of said outer feed wheels, and said former including a pair of bender holders shiftably mounted on said cutter shaft generally in alignment with, and close to, said feed wheels, and a pair of benders mounted on said same shaft on the outer sides of said bender holders, each said bender being provided with a leaf spring which is wide enough to cover at least the periphery of the associated feed wheel, from the dedendum circle to the tooth tops thereof, so as to bend and form each lead in each tooth space of said feed wheel with the revolution of said wheel.

2. An apparatus according to claim 1, wherein said hopper further includes a pressure plate disposed close to the underside of said belt conveyor to press said belt conveyor against said covers and straighten the part leads therebetween.

3. An apparatus for cutting and forming leads comprising a main body which includes a feeder, a cutter, and a former, and a tape guide assembly attached to the body close to the feeder, said tape guide assembly including a pair of tape guides which have inlets for insertion of tapes connecting outer ends of the leads in a row and also have guide slots for guiding the tapes, said tape guides having outlet ends close to said outer feed wheels of said feeder, and a shaft on which said guides are mounted so as to be shiftable in position relative to each other, said feeder including a pair of inner feed wheels having peripheral teeth at a predetermined pitch and spaced apart a distance slightly more than the length of each part body connected with the leads, said inner feed wheels being mounted, so as to be shiftable in position relative to each other, on middle points of a countershaft which, in turn, carries pulleys on both ends, and a similar pair of outer feed wheels again shiftably mounted on the same shaft on the outer sides of said inner feed wheels and at distances where the leads connected to each part body are to be cut, said cutter including a pair of guide holders shiftably mounted on a shaft generally in alignment with, and close to, said outer feed wheels, and cutting blades installed on the inner sides of said guide holders, with their edges extended beyond the dedendum circles of said outer feed wheels, and said former including a pair of bender holders shiftably mounted on said cutter shaft generally in alignment with, and close to, said feed wheels, and a pair of benders mounted on said same shaft on the outer sides of said bender holders, each said bender being provided with a leaf spring which is wide enough to cover at least the periphery of the associated feed wheel, from the dedendum circle to the tooth tops thereof, so as to bend and form each lead in each tooth space of said feed wheel with the revolution of said wheel, said feed wheels and outer feed wheels being driven by a motor the power of which is transmitted through an endless belt to one of said pulleys on said countershaft.

4. An apparatus according to claim 1 wherein the covers are adjustable to vary the distance between the covers and the conveyor.

5. An apparatus according to claim 4 wherein the covers are supported by a shaft member, the position of the shaft member being adjustable for varying the distance between the covers and the belt conveyor.

6. An apparatus according to claim 5 wherein each of the covers is secured to a support member which is slideably mounted to the shaft member.

7. An apparatus according to claim 6 and further including means for releasably securing the support members to the shaft member.

8. An apparatus according to claim 1 wherein the belt conveyor is comprised of three generally parallel endless belts operated by the driving belt wheel.

9. An apparatus according to claim 8 wherein each of the belts includes a plurality of grooves extending across the surface thereof.

10. An apparatus according to claim 9 wherein the grooves of the center belt vary in width.

* * * * *